(12) United States Patent
Kuenemund et al.

(10) Patent No.: US 7,894,242 B2
(45) Date of Patent: Feb. 22, 2011

(54) DEVICE FOR STORING A BINARY STATE

(75) Inventors: Thomas Kuenemund, Munich (DE); Andreas Wenzel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 442 days.

(21) Appl. No.: 12/038,393

(22) Filed: Feb. 27, 2008

(65) Prior Publication Data

US 2008/0205169 A1    Aug. 28, 2008

(30) Foreign Application Priority Data

Feb. 27, 2007   (DE) .................. 10 2007 009 526

(51) Int. Cl.
*G11C 11/00*    (2006.01)
(52) U.S. Cl. .................. 365/154; 365/94; 365/104; 365/156

(58) Field of Classification Search .................. 365/154, 365/94, 104, 156
See application file for complete search history.

(56) References Cited

U.S. PATENT DOCUMENTS

| 6,385,070 B1 * | 5/2002 | Peterson .................. 365/49.15 |
| 2005/0094477 A1 | 5/2005 | Hatsch et al. |
| 2005/0276095 A1 | 12/2005 | Cummings et al. |

FOREIGN PATENT DOCUMENTS

EP   0 669 623 B1   5/2000

* cited by examiner

*Primary Examiner*—Thong Q Le
(74) *Attorney, Agent, or Firm*—Dickstein Shapiro LLP

(57) ABSTRACT

Device for storing a binary state defined by a first binary value and a second binary value complementary thereto, the device capable of being queried by a query signal so as to output, in dependence on a binary masking state, the first binary value at a first output and the second binary value at a second output or vice versa.

22 Claims, 10 Drawing Sheets

DEVICE FOR STORING A BINARY STATE

CROSS-REFERENCE TO RELATED APPLICATIONS

This application claims priority from German Patent Application No. 102007009526.2, which was filed on Feb. 27, 2007, and is incorporated herein in its entirety by reference.

TECHNICAL FIELD

The present invention relates to a device for a storing a binary state as it may occur in the field of memories for security applications, for example.

BACKGROUND

In the field of the conventional technology, combinatory circuits and logic devices may be microelectronically embodied such that each bit of a state stored in a register, for example, is physically represented by precisely one electrical node at the register output. For the thus designated "single rail circuit technology" same applies to all nodes within a combinatory circuit between the registers as well as for the inputs thereof. In general, precisely one electrical node corresponds to one logic value of an (intermediate) state bit or its complement.

In the field of security applications, for memory packages in particular, various methods of attack are known from which memory packages in the field of conventional technology are to be protected. The differential power analysis (DPA) is a common technique for attacking ICs (IC=integrated circuit) and/or memory packages. These attacks also serve for assessing the sensitivity of packages to security applications with respect to deliberate attacks on "confidential" information such as passwords or cryptographic keys. For a given program or a given algorithm, in these attacks, power profiles measured by statistical methods and/or their charge integrals calculated over one or more clock cycles are evaluated wherein, for a multitude of program executions, conclusions to the information to be protected may be drawn from the correlation of systematic data variation and a respective charge integral.

SUMMARY

According to an embodiment, the present invention comprises a device for storing a binary state defined by a first binary value and a second binary value complementary thereto, the device being capable of being queried by means of a query signal so as to output, in dependence on a binary masking state, the first binary value at a first output and the second binary value at a second output or vice versa.

BRIEF DESCRIPTION OF THE DRAWINGS

Embodiments of the present invention will be detailed subsequently referring to the appended drawings, in which.

DETAILED DESCRIPTION

Figure 1A:
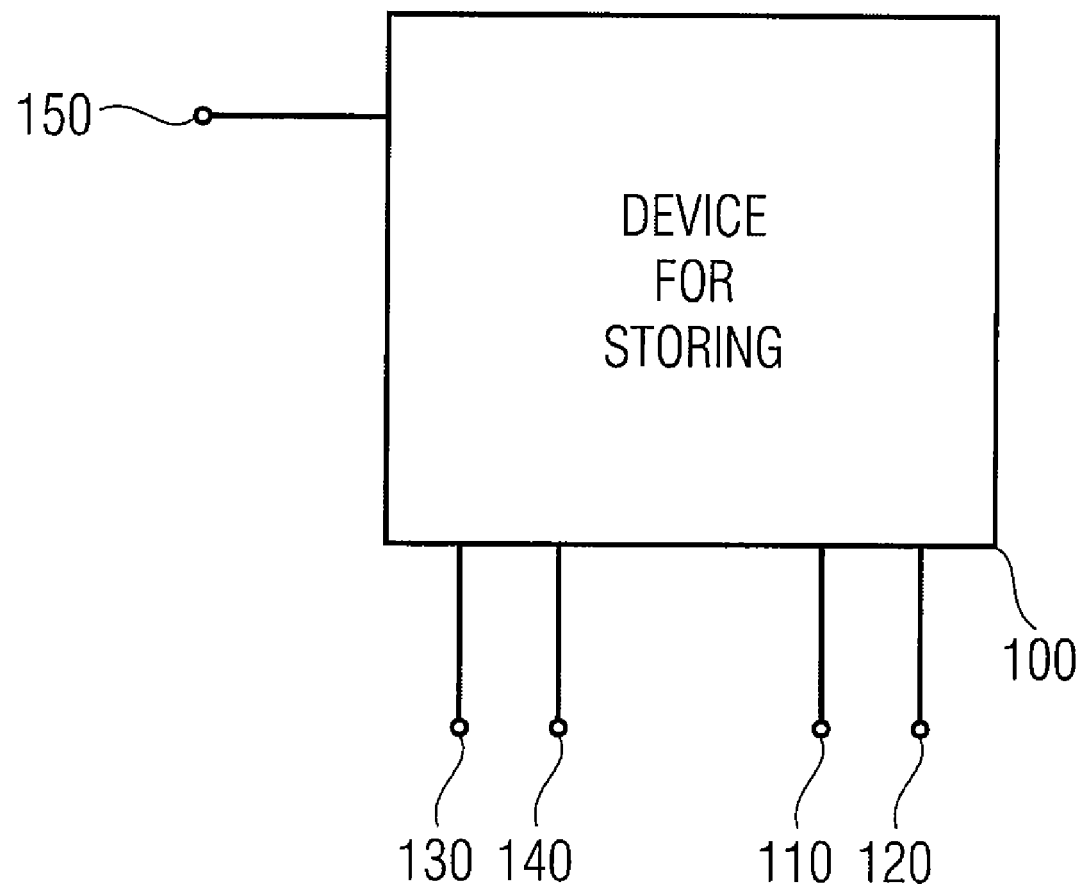
FIG. 1a is an embodiment of a device for storing.

One way to at least substantially impede DPA attacks consists in exchanging or transferring data among subsystems of an IC encrypted only, as far as this is possible. The cryptosystem that is best for this purpose, as it is proven safe, is the so-called one-time-pad encryption. In this method, plaintexts $m=(m_1, m_2, \ldots)$ encoded as a bit sequence are encrypted with keys $k=(k_1, k_2, \ldots)$ obtained from truly random sequences, according to $c=e(k,m)=(k_1 \oplus m_1, k_2 \oplus m_2, \ldots)$, that is, a bit $c_j$ of the ciphertext $c=e(m,k)$ results from the XOR operation $k_j \oplus m_j$ of the corresponding bits of key k and plaintext m. Due to $k \oplus k=0$ and $0 \oplus k=k$, $k_j \oplus c_j=m_j$ holds true, that is, the decryption of c so as to restore the plaintext m, takes place according to the same bitwise XOR operation.

In the one-time-pad cryptosystem, it is important that each key sequence be used only once each for the encryption and the decryption, as otherwise information on plaintexts may be determined by means of statistical methods.

According to the above description on the differential power analysis DPA, it may be concluded that the circuits integrated on an IC should ideally be configured such relative to DPA attacks, that they constantly provide the same power profile, irrespective of the data to be processed. However, this is definitely not the case for the single-rail data path implementation. Here, the time course of the states of charge integrals associated with a circuit is a function of those nodes and/or electrical capacitances that are electrically charge-reversed and therefore exhibits a strong dependence on the temporal changes of the data to be processed.

Embodiments employ the dual-rail logic for implementing the data paths and address paths, as the case may be. In contrast to the conventional single-rail logic, wherein each bit within a data or signal path is physically represented by precisely one electrical node k of a combinatory circuit or logic device, in embodiments having dual-rail logic, each bit is represented by two nodes k and kq, each bit having a valid logic value when k corresponds to the true logic value b of this bit and kq corresponds to the negated logic value bq.

Embodiments achieve the desired invariance of the charge integrals in that between each two states having a valid logic values (b, bq)=(1, 0) or (0, 1), a so-called precharge state is inserted, for which both k and kq are charged to the same electrical potential, that is, assume logically invalid values (1, 1) or (0, 0). For the precharge state (1, 1), therefore, a state sequence could be as follows: $(1, 1) \rightarrow (0, 1) \rightarrow (1, 1) \rightarrow (1, 0) \rightarrow (1, 1) \rightarrow (1, 0) \rightarrow (1, 1) \rightarrow (0, 1) \ldots$.

For any such state sequence, it is true that in each transition $(1, 1) \rightarrow (b, bq)$, precisely one node is charged-reversed from 1 to 0, and for all $(b, bq) \rightarrow (1, 1)$, precisely one node is charge-reversed from 0 to 1, independently of the logically valid value b of the state bit in question. Same applies to state sequences having the precharge state (0, 0).

This, however, results in the fact that the charge integrals corresponding to these state sequences are independent of the sequence (b, bq) of the logically valid values, if it is only seen to that the nodes k and kq have equal electrical capacitances. The power profile of a data path implemented such is therefore not dependent on temporal variations of the data to be processed, which is why embodiments may therefore be DPA-resistant.

FIG. 1a shows a device 100 for storing a binary state defined by a first binary value and a second binary value complementary thereto, the device 100 capable of being queried by means of a query signal, so as to output, in dependence on a binary masking state, the first binary value at a first output 110 and the second binary value at a second output 120 or vice versa.

In embodiments, the masking state may be defined by a first masking value and a second masking value complementary thereto, wherein the device 100 may then comprise an input 130 for the first masking value and an input 140 for the second masking value. The device 100 may further comprise a third input 150 for the query signal.

Embodiments may be implemented in the dual-rail implementation for storing the binary state. Furthermore, the binary values may be stored and/or output according to the OTP method. In one embodiment, the storing is effected in an ROM (read only memory) cell, whereas, in other embodiments, other memory cells such as RAM (random access memory) may also be used. In embodiments, the query signal may be routed into the interior of the device 100 via a word line, wherein the word line may be embodied as security wiring such as by polysilicon or realized in a first metal layer. Here, the first metal layer is that metal layer in an embodiment, which is, in an implementation of the device 100 on a chip or substrate, for example, furthest away from a surface of the device 100. In another embodiment, the word line is located in a metal layer, the metal layer being deposited at least under one further metal layer and an insulating layer.

Furthermore, in embodiments, the output lines for the first and second binary values as well as the input lines for the first masking value and the second masking value may be realized by means of security wiring such as polysilicon, or in an inner metal layer. In another embodiment, the input or output line may be realized in a metal layer, the metal layer being deposited at least under a further metal layer and an insulating layer.

In a further embodiment, the word line may be arranged between two input and output lines, the lines surrounding the word line functioning as a shielding and, in one embodiment, forming a Faraday cage for the shielding from electromagnetic signals from the word line.

In a further embodiment, the device 100 is realized by a circuit 100 for storing a binary state having an input 150 for a binary query signal, an input 130 for a first masking value, an input 140 for a second value, an output 110 for a first binary value and an output 120 for a second binary value.

In an embodiment, the circuit is configured to output, at an output 120 for the second binary value, the complementary first binary value. Furthermore, the circuit may be configured to receive, at the input 140 for the second masking value, the complementary first masking value. In a further embodiment, the circuit 100 may be configured to invert the output 110 for the first binary value when an inverted masking value is present at the input 130 for the first masking value.

In other embodiments, the input 150 for the query signal may be coupled to a field-effect transistor (FET) via a word line. The word line may in turn be realized in polysilicon or in a first metal layer. Alternatively, the word line may be realized in a metal layer, the metal layer being arranged at least under a further metal layer and an insulating layer.

In further embodiments, the circuit 100 may comprise multiple field-effect transistors, the circuit 100, for example, comprises a first FET, which is connected to a reference potential, coupled to the output 110 for the first binary value via a second FET, and coupled to the output 120 for the second binary value via a third FET. In one embodiment, the first FET may be controllable by the word line.

In a further embodiment, the second FET may be controllable via the input 140 for the second masking value, and the third FET may be controllable via the input 130 for the first masking value.

In a further embodiment, the circuit 100 is realized in a memory cell 100 having a word line 150 for a binary query signal, in a first masking line 130 for a first binary masking value, in a second masking line 140 for a second binary masking value, in a first bit line 110 for a first binary value and in a second bit line 120 for a second binary value. The memory cell further comprises a circuit coupled to the word line 150, the first masking line 130, the second masking line 140, the first bit line 110 and the second bit line 120 so as to output, in dependence on a first binary masking state defined by the first binary masking value at the first masking line 130 and the second binary masking value at the second masking line 140, a first state for the first binary value at the first bit line 110 and a second state complementary to the first binary state for the second binary value at the second bit line 120 and, in the case of a second binary masking state complementary to the first masking state, the second binary masking state being defined by the first binary masking value at the first masking line 130 and the second binary masking value at the second masking line 150, output the first state for the first binary value at the second bit line 120 and the second state for the second binary value at the first bit line 110.

In a further embodiment, the memory cell 100 may be configured to receive, at the second masking line 140 for the second masking value, the complementary first binary masking value. The memory cell 100 may be configured to invert the first binary value when an inverted masking value is present for the first binary masking value. Furthermore, the word line 150 for the binary query signal may be coupled to a control input of a transistor and/or be realized in polysilicon or in a metal layer, the metal layer being arranged at least under a further metal layer and an insulating layer. In an embodiment, the memory cell 100 comprises an ROM cell or a tile of ROM cells. The word line 150 may be arranged between two of the bit or masking lines 110; 120; 130; 140 of the memory cell 100.

A masked read-only memory, that is, a one-time-pad-masked read-only memory, OTP mROM (mROM=masked ROM) for security applications therefore realizes a further embodiment. One advantage of this read-only memory is the resistance to DPA, electromagnetic analysis (EMA) and invasive tapping, the so-called probing.

The embodiments of the present invention achieve this resistance by bitwise XOR masking of all addresses and data with time-varying so-called "one-time-pad (OTP)" masks, for example. Furthermore, the embodiments comprise a dual-rail implementation of substantial parts of the address and/or data path, that is, charge-neutral circuits as well as a self-clocking autonomously clocking individual components of the read-only memory. Thus, the embodiments avoid short-time pulses on signal lines, which may arise due to transit-time differences (these impulses are also referred to as glitches) and represent at least a theoretical risk of a DPA attack. Furthermore, the embodiments are provided with a security wiring of particularly relevant signals or signal paths. Word lines may be implemented in MOS (metal oxide semiconductor)-gate polysilicon or in metal 1, for example, that is, in a first or inner metal layer of a chip, bit lines in metal 1 etc. The embodiments implemented in chips furthermore dispose of very tight packing as well as vertical layering of the wiring so as to prevent the feasibility of probing and EMA, as a Faraday cage, for example, around a word line, may be realized by means of the respective packing.

The embodiments further offer the possibility of realizing a scrambling or interweaving word and bit lines as well as their distribution among several tiles of mROM cells, for example, which further substantially impedes the allocation of addresses and associated data.

The embodiments further provide, such as in AES (advanced encryption standard), the possibility of a temporally random sequence of the mROM addresses and/or accesses to the mROM, which is controlled by appropriately created random bits.

The embodiments are therefore utilized in so-called S boxes (S=substitution) for the DES (data encryption standard), the AES as well as for command decoders in CPUs for chip card controllers with high security requirements for example. Drawbacks of conventional systems rooted in a limited resistance to DPA, EMA and probing, for example, are therefore avoided by the embodiments. Furthermore, embodiments, as compared to conventional systems, improve the area and energy overhead and realize higher computing speed. Furthermore, the embodiments reduce the influence of capacitive imbalances on the sensitivity to DPA.

Figure 1B:
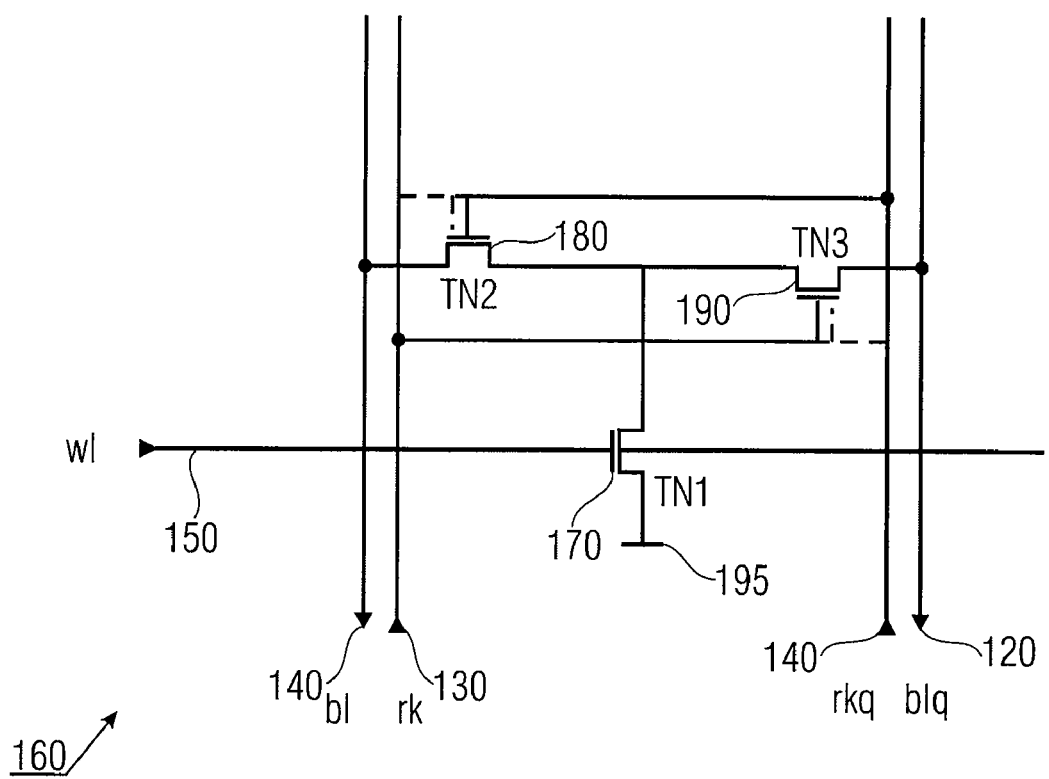
FIG. 1b is an embodiment of a circuit for storing.

FIG. 1b shows an mROM cell 160. The mROM cell 160 is programmed to logic 0, wherein a programming to logic 1 is denoted by connections drawn in dashed lines. The mROM cell 160 shows a word line 150 at which a binary query signal may be applied. Furthermore, the mROM cell 160 exhibits a first output 110 for a first binary value bl and a second output 120 for a second binary value blq, which is complementary to the first binary value bl. Furthermore, the mROM cell 160 exhibits a first input 130 for a first masking value rk and a second input 140 for a second masking value rkq, which is complementary to the first masking value rk.

In the following Figures, the logic elements, which are predominantly realized by n-channel and p-channel FETs, are designated by their control signals, which are indicated in small letters and/or small letters superscript dash, when an inverted signal is designated. For reasons of clarity, the introduction of additional reference numerals for all devices is omitted. Signals implemented in dual-rail logic are indicated by small letters such as rk and bl in FIG. 1b, and the complementary components are indicated by a subsequent small-letter q such as rkq and bkq in FIG. 1b.

FIG. 1b shows an exemplary implementation of an mROM cell 160 having n-channel FETs. This specific implementation only represents an embodiment and is not limiting, other embodiments are conceivable in implementations having p-channel FETs or other transistors and/or electrical switches. FIG. 1b further shows a first transistor 170, also referred to as TN1, which is coupled to the input 150 and controllable via the word line wl. The transistor 170 is on the one hand coupled to a reference signal or a reference potential 195 and, via a second FET 180, also referred to as TN2, coupled to the output 110 for the first binary value. Furthermore, the transistor 170 is coupled, via a third FET 190, also referred to as TN3, to the output 120 for the second binary value. The second FET 180 is, according to FIG. 1b, controllable from the second masking value rkq and/or via the input 140. The third FET 190 is controllable via the first masking value rk and/or via the input 130.

The connection represented in FIG. 1b therefore corresponds to a stored logic 0, wherein the dashed lines denote the control of the transistors 180 and 190, for the case that a logic 1 was stored. The consideration of the embodiment of the stored logic 0 is not meant limiting.

According to FIG. 1b, the bit-line pair (bl,blq), for an activated word line, wl=1, and with the masking values (rk, rkq)=(0, 1), is brought from its precharge state (1, 1) to the state (0, 1), whereas for (rk,rkq)=(1, 0), the denotations of bl and blq are interchanged as (bl, blq) then assumes the state (1, 0). In embodiments, sufficiently frequent and infrequent interchanging of (rk, rkq) also each time interchanges the denotations of bl and blq. The risk of a DPA attack may thus be reduced and in one embodiment even prevented, and probing is also substantially impeded.

Figure 2:
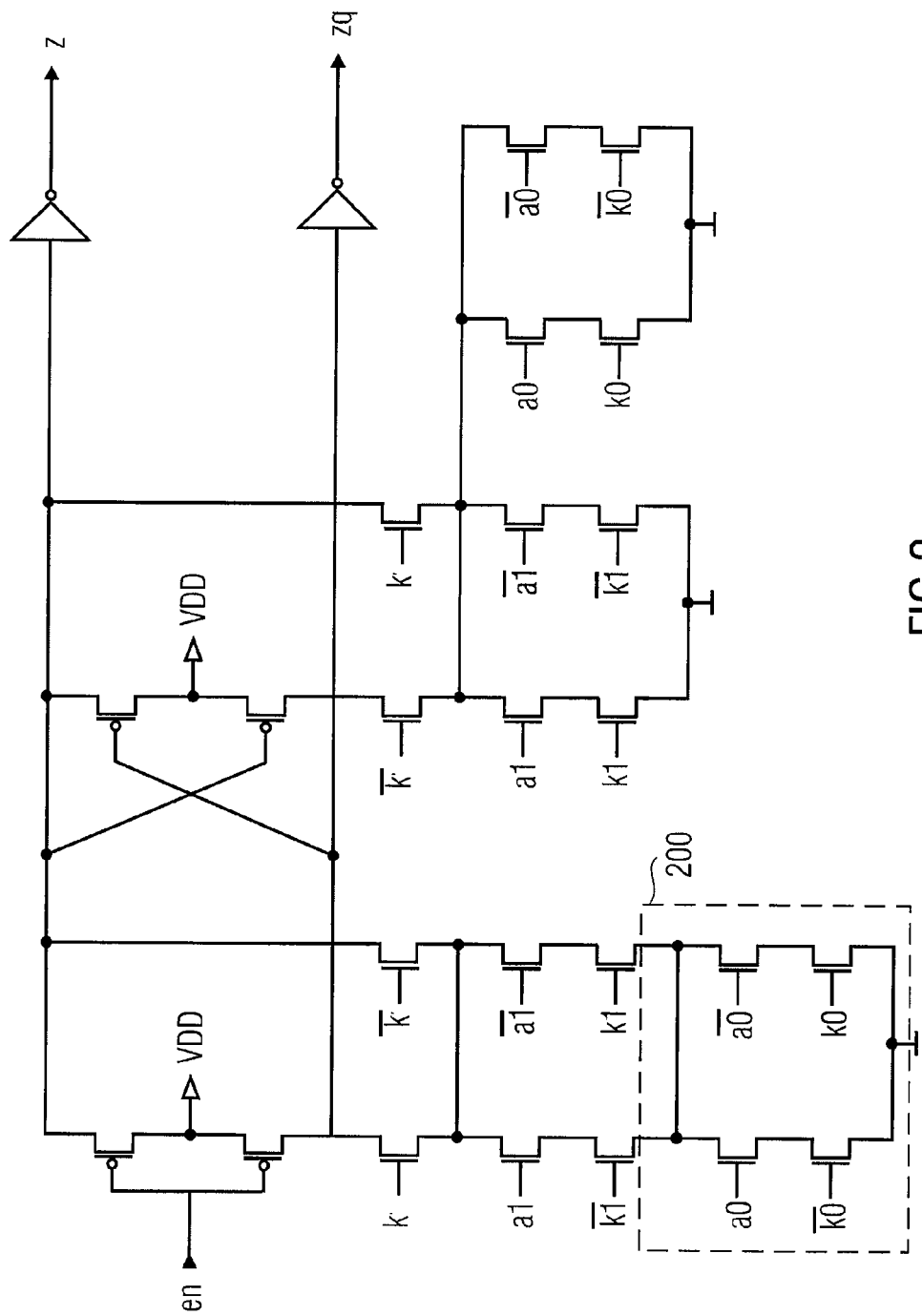
FIG. 2 is an embodiment of a masking decoder for two address bits.

FIG. 2 shows an embodiment of a masked decoder for two address bits a1 and a0 with the masks k1 and k0, whereas the output signal z is masked with k'. The circuit in FIG. 2 is embodied in dual-rail circuit technology with precharge, particularly in DCVSL (dual-cascade voltage switch logic). With the signal en=0, the circuit is in the precharge state (z, zq)=(0, 0), wherein, in an embodiment, it is seen to that none of the pull-down paths is conductive as long as en=0 is true. This may be achieved, for example, by holding a1, a0 and the respective complements, that is, $\overline{a1}$ and $\overline{a0}$, at 0 by means of appropriate circuits, until the evaluation process is initiated by means of en=1. Such a circuit will be explained in greater detail in the following with respect to FIG. 7, while, at this point, it be presumed that the pull-down paths are not conductive as long as en=0 is true. An alternative realization of this condition would be the result of a further n-channel transistor controlled with en at the gate, the transistor being connected between ground and the transistors connected to ground in FIG. 2. The circuit shown in FIG. 2 therefore realizes the logic function $$z = k' \oplus \prod_{j=0}^{1} (aj \oplus kj).$$

In the following, the function of the circuit branch 200 is exemplarily discussed, which realizes the function $$(a0 \oplus k0)$$

The circuit branch 200 shows that same is in turn composed of two branches, one of which each is rendered conductive when the signals a0 and k0 assume different logic values, that is, for (a0, k0)=(1, 0) and/or for (a0, k0)=(0, 1), which corresponds to the XOR operation. Analogously, the other circuit branches in FIG. 2 and the subsequent figures may be analyzed.

The terminals designated with VDD in FIG. 2 and the subsequent figures, are, in the respective embodiments, connected to the supply voltage, such as +1.5 V.

Figure 3:
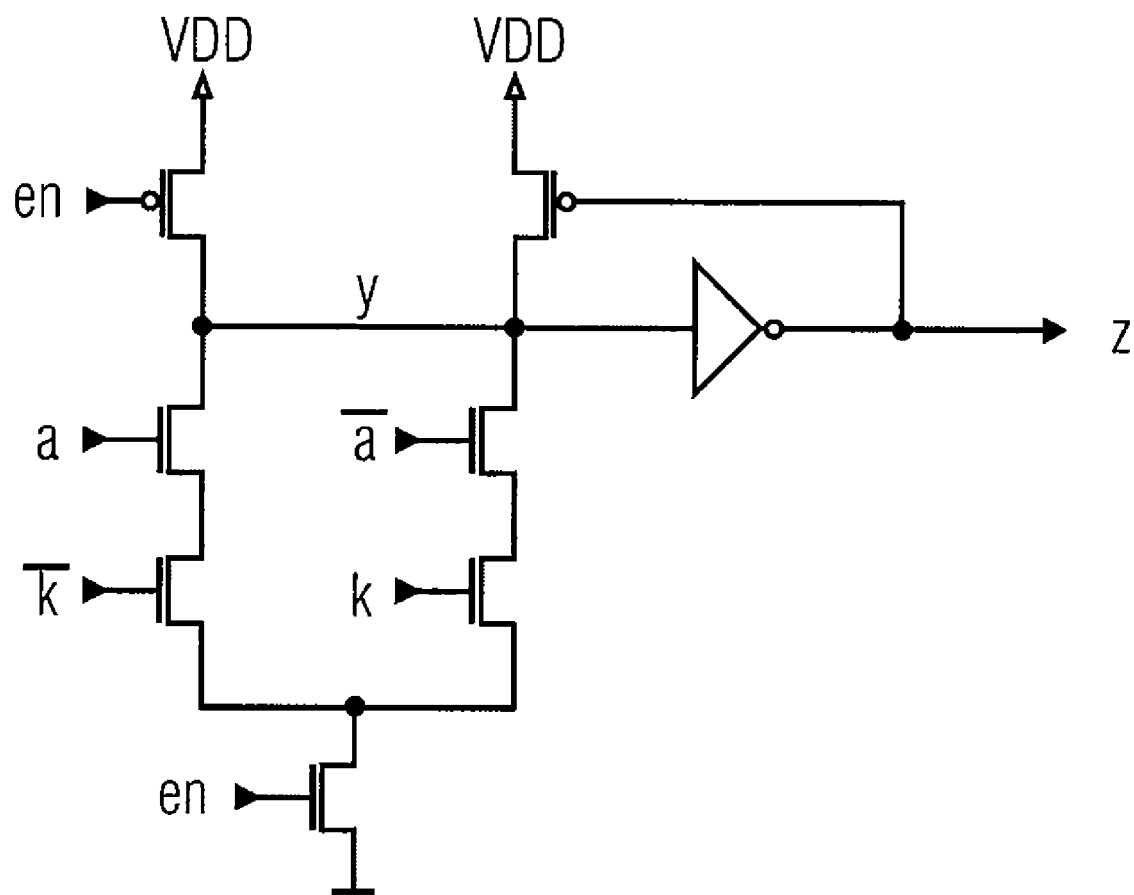
FIG. 3 is an embodiment of a dynamic word-line driver for demasking.

FIG. 3 shows an embodiment of a dynamic word-line driver with demasking. The dynamic word-line driver realizes the function $$z = en \cdot (a \oplus k).$$

The two transistors, the control terminals of which are designated with en (enable) in turn serve for shifting the circuit to a precharge state. The dynamic word-line driver serves for demasking the decoded (one-hot) word-line address a masked with k. The output z may be connected to a word line such as the line wl of FIG. 1b. In a further embodiment, the n-channel transistor connected with en at the gate may be omitted if a and/or k and the complements thereof fulfill conditions corresponding to the ones described above under FIG. 2, that is, when they are held at 0 during the precharge phase.

Figure 4:
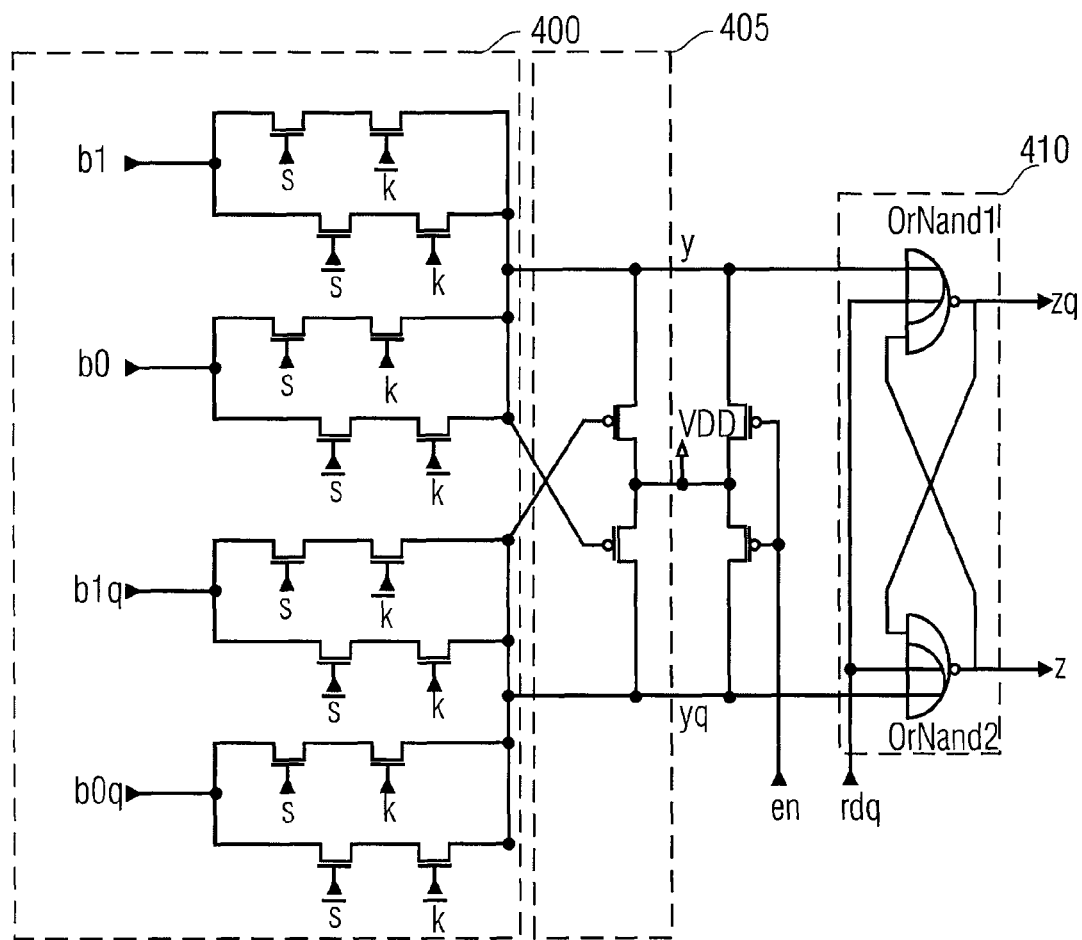
FIG. 4 is an embodiment of a bit-line multiplexer having a peripheral circuit.

FIG. 4 shows an embodiment of the bit-line multiplexer with peripheral connection. From left to right, FIG. 4 first shows a pass-gate multiplexer 400 for two bit-line pairs (b0, b0q) and (b1, b1q) and the select signal s masked with k. The pass-gate multiplexer 400 realizes the two functions $$y=(s\oplus k)\cdot b1+\overline{s\oplus k}\cdot b0,$$

$$yq=(s\oplus k)\cdot b1q+\overline{s\oplus k}\cdot b0q.$$

The pass-gate multiplexer therefore serves for selecting one of two bit-line pairs imparted with the same mask rk, wherein the result y of this operation exhibits the same mask rk. This condition may also be realized by further input-side and output-side pass-gate XOR stages.

In FIG. 4, the signal input en with the associated p-channel transistors serves for the realizing the precharge state. In addition, FIG. 4 contains a hold function realized by the p-channel cross coupling 405 as well as a data-output latch 410, with the input rdq as an enable signal, wherein rdq and the transistors connected thereto may also be omitted when the temporal behavior of en fulfills certain conditions dependent on the mROM total circuit, which may be realized in embodiments.

Figure 5:
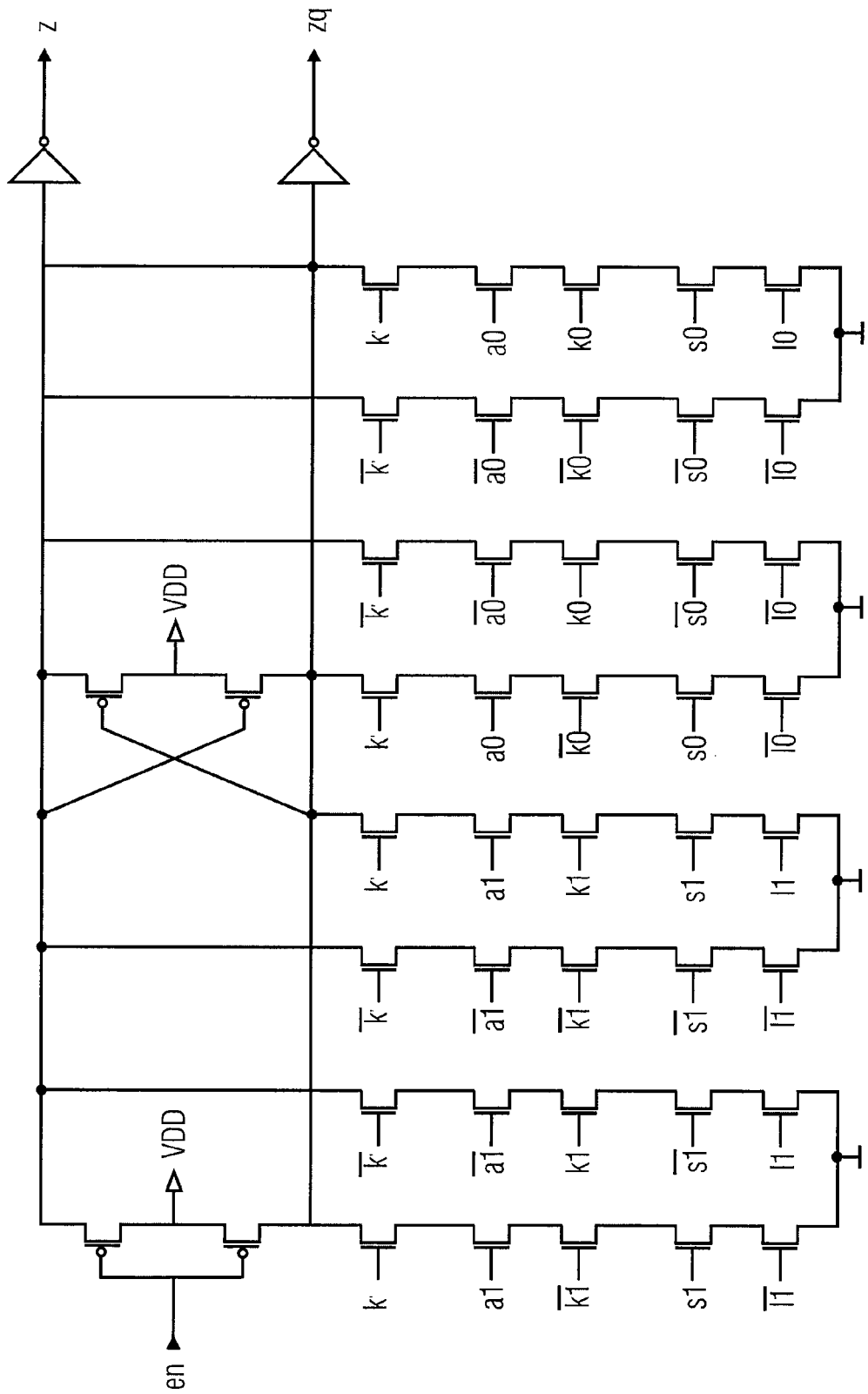
FIG. 5 is an embodiment of a masked multiplexer for two input and two selection signals.

FIG. 5 shows an embodiment of a masked multiplexer for two input and two selection signals. FIG. 5 shows a multiplexer embodied in DCVSL for two data inputs a1 and a0 masked with k1 and k0 as well as select signals s1 and s0 masked with l1 and l0. As according to the circuit in FIG. 5, for two inputs, s1 is equal to the complement of s0, the circuit may also be further simplified in embodiments as the one of the cascades for s1 or l1 may be used twice, these redundant cascades were, however, maintained as the generalization of a masked multiplexer from two to several data inputs is in this way easier to observe. The data output z is masked with k', and the multiplexer realizes the function $$z = k' \oplus \sum_{j=0}^{1}(sj \oplus kj)\cdot(aj \oplus lj).$$

Figure 6:
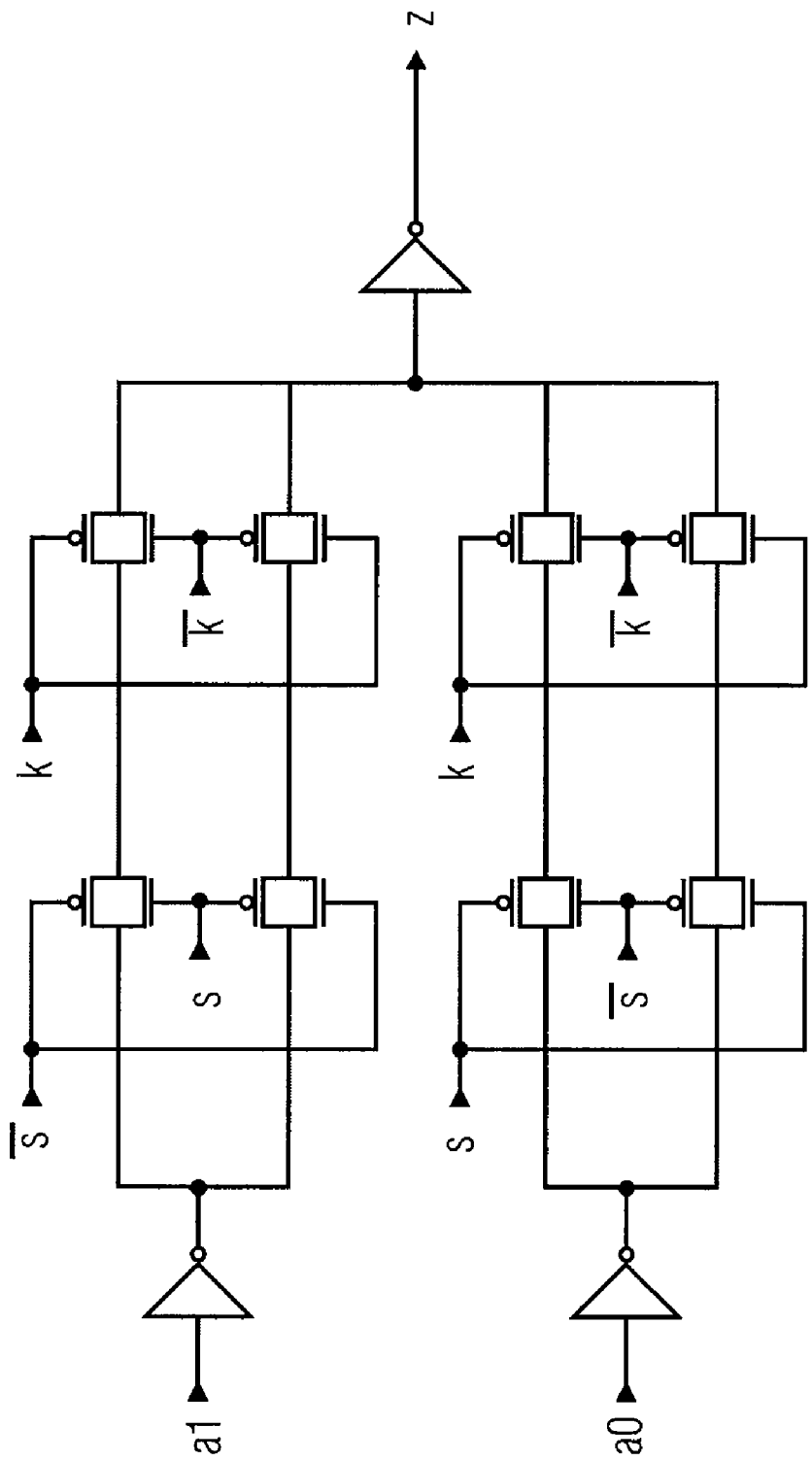
FIG. 6 is a multiplexer for two input signals with a masking in transmission-gate technology.

FIG. 6 shows a multiplexer embodied in transmission-gate circuit technology for two data inputs a1 and a0 as well as the select signal s masked with k. The function realized by the multiplexer yields $$z=(s\oplus k)\cdot a1+\overline{s\oplus k}\cdot a0.$$

The result is that the multiplexer is suitable to select one of two data inputs imparted with the same mask, wherein the result z of this operation also exhibits the same mask.

Figure 7:
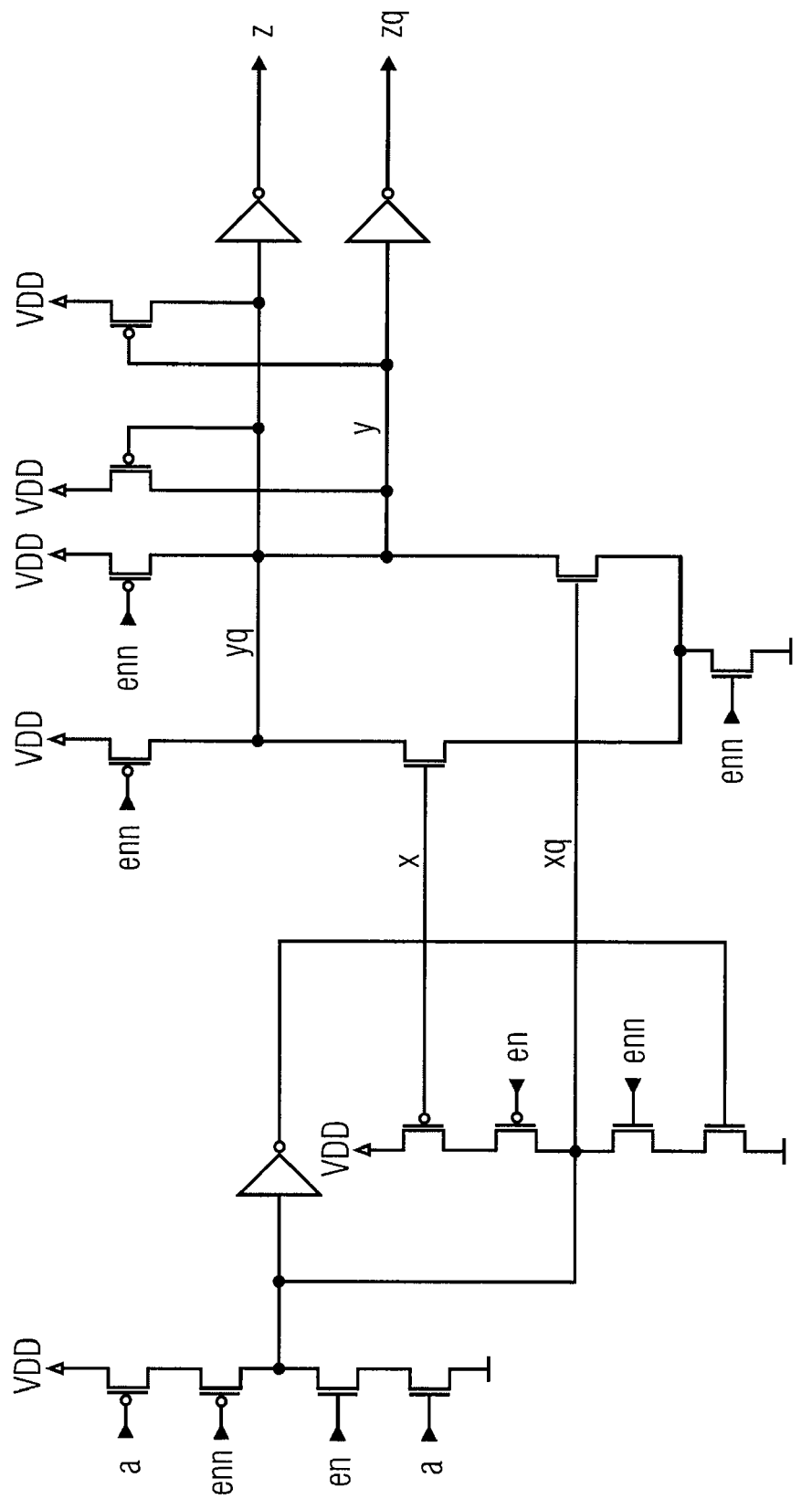
FIG. 7 is an embodiment of an address latch with single-to-dual rail conversion.

FIG. 7 shows an above-mentioned address latch with simultaneous conversion of a single-rail input a to a dual-rail output (z, zq). According to the circuit in FIG. 7, the result for (en, enn)=(1, 0) is that the value of a is taken over to the input-side latch, while the output stage is in the precharge state (z, zq)=(0, 0). With the change from (en, enn) to (0, 1), the value taken over previously is then output by a in dual-rail form, that is, complementary, on (z, zq).

Figure 8:
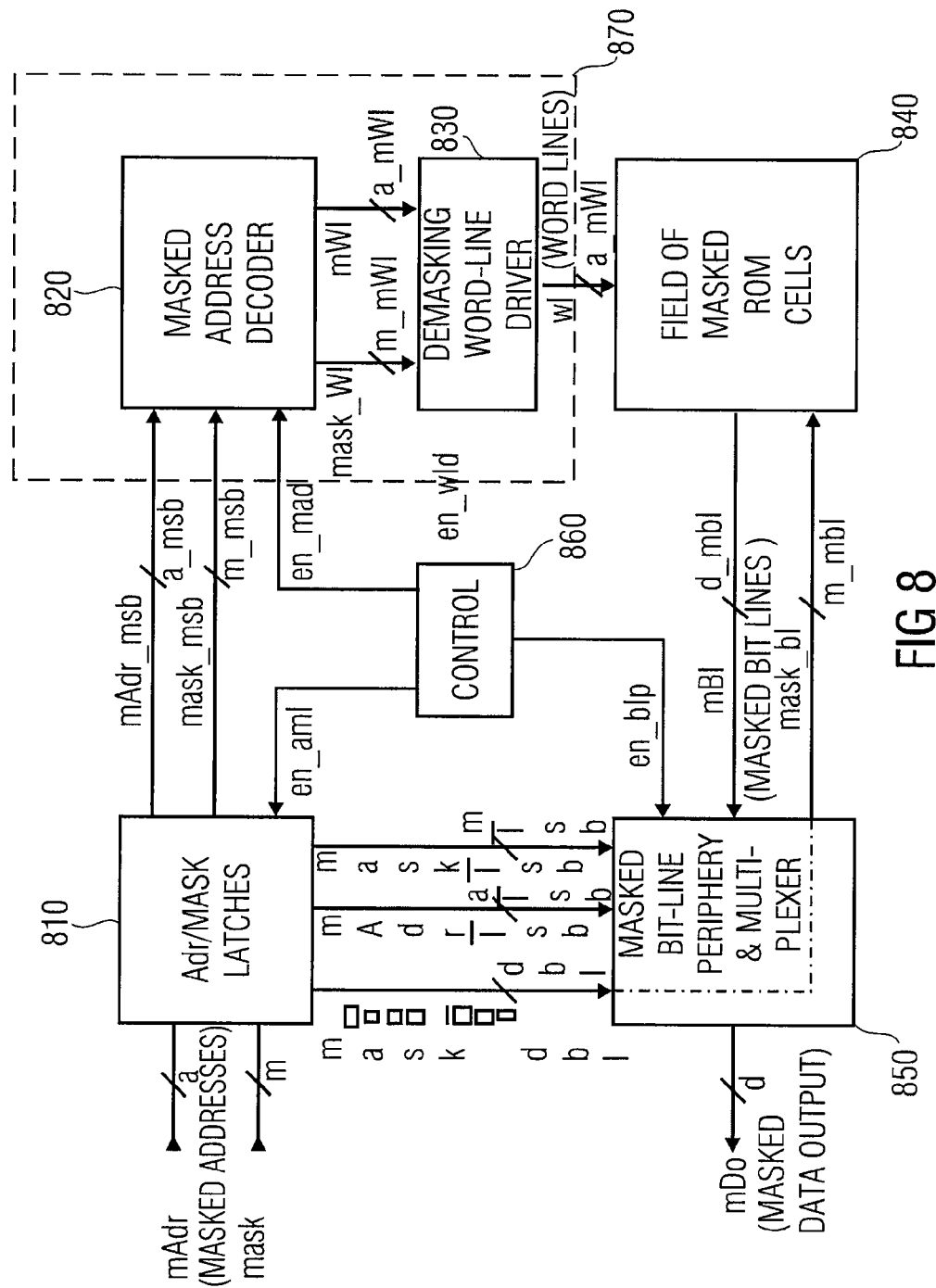
FIG. 8 is an embodiment of an mROM block diagram.

Furthermore, in further embodiments, represented in FIG. 8, for example, a system with a field (840) of memory cells may be realized, wherein the word lines of a plurality of memory cells are coupled and the system further comprises a word-line decoder (870) coupled to the word lines of the field (840) of memory cells and controllable via first address lines. The system may further comprise a bit-line multiplexer (850), which is coupled to the bit lines and the masking lines of the field (840) of memory cells, is controllable via second address lines and comprises output lines for masked binary values.

The word-line decoder 870 may comprise a further input line for further binary masking values so as to link the further binary masking values to values of the first address lines. The word-line decoder (870) may be realized, for example, by a masked address decoder (820) and a word-line driver (830). The bit-line multiplexer (850) may comprise an input line for binary masking values so as to link the binary masking values to values of the second address lines. The bit-line multiplexer (850) may further comprise further input lines for further binary masking values, so as to control, based on the further binary masking values, the masking lines of the field (840) of memory cells.

In further embodiments, a memory cell or a system according to the above description may be realized on a smartcard, chip card or in an S-box ROM.

FIG. 8 shows an embodiment of a block diagram of an mROM. The block diagram in FIG. 8 shows an mROM address and/or data flow. FIG. 8 shows an address latch with single-to-dual-rail conversion 810, which could be realized according to FIG. 7. FIG. 8 further shows a masked address decoder 820, which may be realized according to FIG. 2. Furthermore, FIG. 8 shows a word-line driver 830, which may be implemented according to FIG. 3, for example. In an embodiment, the masked ROM cell 840 may be assembled according to a plurality of masked ROM cells of the embodiment of FIG. 1. FIG. 8 further shows a masked bit-line multiplexer 850 with a peripheral connection according to FIG. 4. Furthermore, FIG. 8 shows the control block 860 providing the en signals for the individual components and therefore realizing a self-clocking.

The control block 860 further coordinates the precharge states of the individual components. The individual signals, which are interchanged among the function blocks 810 to 860, are designated in FIG. 8 and will be explained in greater detail in the following. The address latch 810 is from the outside provided with address inputs mAdr having a width of a bits, which are masked with a mask resulting from a further input signal mask having a width of m bits. From these two input signals, the address latch 810 may forward the mAdr_msb (msb=most significant bit) highest-order addresses with a width of a_msb bits to the masked address decoder 820 for selection, which, based on a mask mask_msb with a width of m_msb bits performs a demasking thereof.

The masking signal mask_msb results from the input signal mask, wherein several embodiments are conceivable, in one embodiment, this signal directly results from the input signal, in another embodiment, it may be derived from the input signal, with the help of random generators or pseudo random generators, for example.

The masked address decoder 820 may now forward the signals mask_Wl with a width of m_mwl bits to the word-line driver 830 for the demasking of the signals mWl with a bit width of a_mWl. The word-line driver 830 is then capable of extracting, from these signals, the word-lines signals with a width of a_mWl bits, which, in the embodiment in FIG. 8, are present as plaintext. Based on these signals, the masked ROM cell 840 may now read an address area and provide same to the masked bit-line multiplexer 850 with a width of d_mbl bits in a signal mBl. The masked bit-line multiplexer 850 further receives, from the address latch 810, the signals mAdr_lsb (lsb=least significant bit) with a width of a_lsb bits and the signal mask_lsb with a width of m_lsb bits for the masking thereof. Based on these signals, the masked bit-line multiplexer 850 may then extract the desired data from the data area provided by the masked ROM cell field 840 and provide same at the output as mDo with a width of d bits. The masking bit-line multiplexer further receives, from the address latch, the signal mask_dbl, which same forwards to the masked ROM cell field 840, and on the basis of which the data areas may be masked, that is, these signals allow the bitwise switching between normal and complementary representation of the data area.

The control block 860 coordinates the individual precharge states of the components and realizes the self-clocking, as described above.

That is, in FIG. 8, mAdr stand for the a-bit-wide masked address inputs, mask represents the m-bit-wide masks for at least mAdr and mDo, the d-bit-wide outputs masked with mask. The signals mAdr_msb, which are a_msb bits wide, comprise the highest-order (dual-rail) addresses for the selection of a_mWl masked word lines mWl, mask_msb and mask_Wl comprise the corresponding m_msb-bit or m_mWl-bit-wide masks, respectively. The signals wl comprise the a_mwl-bit-wide word lines and in general several mROM cell fields, which may be read in parallel and are present as plaintext in the embodiment considered. The signal mBl comprises the d_mBl-bit-wide bit-line pairs masked with the m_mBl-bit-wide masks of generally several mROM cell fields, from which the d-bit-wide data outputs mDo are selected with the mAdr_lsb-bit-wide lowest order and with the m_lsb (the a_lsb-bit-wide lowest-order dual-rail addresses masked with the m_lsb-bit-wide masks mask_lsb).

The unit control 860 here provides all circuit parts involved with control signals en_aml, en_mad, en_wld and en_blp, which are substantially capable of being derived from an external clock and/or enable signal.

Figure 9:
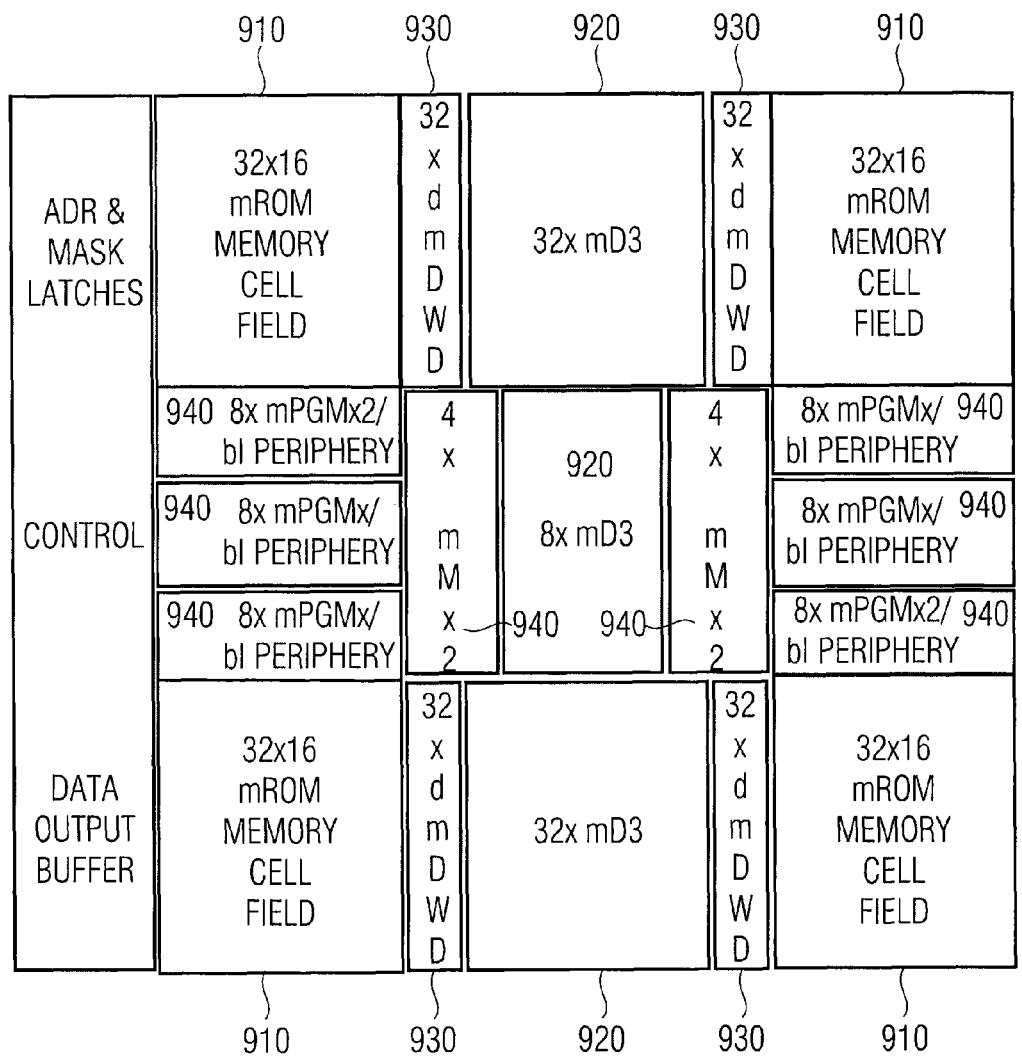
FIG. 9 is an embodiment of an mROM floor plan.

FIG. 9 shows an embodiment of a floor plan for an mROM implementation example. In this embodiment, a 256-byte mROM organized as a 4-tile memory architecture with 32 words à 16 bits each is considered. FIG. 9 shows the four tiles 910, wherein the five msb of the masked addresses are masked and decoded in two stages 920 (8×mD3+2×32×mD3) and converted to the 4×32 word lines in the dynamic wordline drivers 930, compare 820 and 830 in FIG. 8. From the read-out 4×16 bit-line pairs, the 8-bit-wide masked data outputs are then selected in three stages 940 (4×8×mPGM×2+ 2×8×mTGM×2+2×4×mM×2) by means of the three lsb of the masked addresses, compare 840 in FIG. 8.

The embodiments therefore provide advantages in security applications in so far as attacks such as DPA, EMA and probing are substantially impeded or no longer possible.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A device for storing a binary state defined by a first binary value and a second binary value complementary thereto, the device configured to be queried by a query signal so as to output, dependent on a binary masking state, the first binary value at a first output and the second binary value at a second output or vice versa, the device comprising a dual-rail implementation for storing the binary state.

2. The device according to claim 1, wherein the masking state is defined by a first masking value and a second masking value complementary thereto.

3. The device according to claim 1, integrated into a smart card.

4. A device for storing a binary state defined by first binary value and a second binary value complementary thereto, the device configured to be queried by a query signal so as to output, dependent on a binary masking state, the first bin value at a first output and the second binary value at a second output or vice versa, and adapted to store and/or output binary values according to the one-time-pad method.

5. A device for storing a binary state defined by first binary value and a second binary value complementary thereto, the device configured to be queried by a query signal so as to output, dependent on a binary masking state, the first binary value at a first output and the second binary value at a second output or vice versa, wherein the storing is realized by a ROM cell.

6. A device for storing a binary state defined by first binary value and a second binary value complementary thereto, the device adaptable to be queried by a query signal so as to output, dependent on a binary masking state, the first binary value at a first output and the second binary value at a second output or vice versa, the device further comprising a word line for the query signal, wherein the word line is realized in polysilicon or in a metal layer, the metal layer being arranged at least under a further metal layer and an insulating layer.

7. A device for storing a binary state defined by first binary value and a second binary value complementary thereto, the device configured to be queried by a query signal so as to output, dependent on a binary masking state, the first binary value at a first output and the second binary value at a second output or vice versa, the device further comprising two output lines for the first binary value and the second binary value and two input lines for the first masking value and the second masking value, wherein the two input lines or the two output lines are realized in polysilicon or in a metal layer, the metal layer being arranged at least under a further metal layer and an insulating layer.

8. A circuit for storing a binary state, comprising:
   an input for a binary query signal;
   an input for a first binary masking value;
   an input for a second binary masking value;
   an output for a first binary value; and
   an output for a second binary value, ,
   wherein the word line is realized by polysilicon or in a metal layer, the metal layer being arranged at least under a further metal layer and an insulating layer.

9. A circuit for storing a binary state, comprising:
   an input for a binary query signal;
   an input for a first binary masking value;
   an input for a second binary masking value;
   an output for a first binary value;
   an output for a second binary value; and
   a first field-effect transistor connected to a reference potential and coupled to an output for the first binary value via a second field-effect transistor and coupled to the output for the second binary value via a third field-effect transistor.

10. The circuit according to claim 9, the circuit forming a single memory cell of a memory cell array.

11. The circuit according to claim 9, wherein the input for the query signal is coupled to a field-effect transistor via a word line.

12. The circuit according to claim 9, wherein the first field-effect transistor is controllable by a word line.

13. The circuit according to 9, wherein the input for a binary query signal is connected to a word line, the input for a first binary masking value is connected to a first masking line, the input for a second binary masking value is connected to a second masking line, the output for a first binary value is connected to a first bit line, and the output for a second binary value is connected to a second bit line.

14. A memory cell, comprising:
   a word line for a binary query signal;
   a first masking line for a first binary masking value;
   a second masking line for a second binary masking value;
   a first bit line for a first binary value;
   a second bit line for a second binary value; and
   a circuit coupled to the word line, the first masking line, the second masking line, the first bit line and the second bit line so as to output, in dependence on a first binary masking state defined by the first binary masking value at the first masking line and the second binary masking value at the second masking line, a first state for the first binary value at the first bit line and a second state complementary to the first binary state for the second binary value at the second bit line, and, in the case of a second binary masking state complementary to the first masking state, which is defined by the second binary masking value at the first masking line and the first binary masking value at the second masking line, output the first state for the first binary value at the second bit line and the second state for the second binary value at the first bit line.

15. The memory cell according to claim 14, which is adapted to receive, at the second masking line for the second masking value, the complementary first binary masking value.

16. The memory cell according to claim 14, which is adapted to invert the first binary value when an inverted masking value is present for the first binary masking value.

17. The memory cell according to claim 14, wherein the word line for the binary query signal is coupled to a control input of a transistor.

18. The memory cell according to claim 14, further comprising a ROM cell.

19. The memory cell according to claim 14, integrated into a smart card.

20. A system with a field of memory cells, a memory cell comprising:
   a word line for a binary query signal;
   a first masking line for a first binary masking value;
   a second masking line for a second binary masking value;
   a first bit line for a first binary value;
   a second bit line for a second binary value;
   a circuit coupled to the word line, the first masking line, the second masking line, the first bit line and the second bit line so as to output, in dependence on a first binary masking state defined by the first binary masking value at the first masking line and the second binary masking value at the second masking line, a first state for the first binary value at the first bit line and a second state complementary to the first binary state for the second binary value at the second bit line, and, in the case of a second binary masking state complementary to the first masking state, which is defined by the second binary masking value at the first masking line and the first binary masking value at the second masking line, output the first state for the first binary value at the second bit line and the second state for the second binary value at the first bit line;
   a word-line decoder coupled to the word lines of the field of memory cells and controllable via first address lines; and
   a bit-line multiplexer coupled to the bit lines and the masking lines of the field of memory cells and controllable via second address lines and comprising output lines for masked binary values.

21. The system according to claim 20, wherein the bit-line multiplexer further comprises an input line for binary masking values so as to link the binary masking values to values of the second address lines.

22. The system according to claim 20, wherein the bit-line multiplexer further comprises further input lines for further binary masking values so as to control, based on the further binary masking values, the masking lines of the field of memory cells.

* * * * *